United States Patent [19]

Tanaka

[11] Patent Number: 5,014,019

[45] Date of Patent: May 7, 1991

[54] AMPLIFIER CIRCUIT OPERABLE AT LOW POWER SOURCE VOLTAGE

[75] Inventor: Tatsuo Tanaka, Kanagawa, Japan

[73] Assignee: Kabushiki Kaisha Toshiba, Kanagawa, Japan

[21] Appl. No.: 476,836

[22] Filed: Feb. 8, 1990

[30] Foreign Application Priority Data

Feb. 20, 1989 [JP] Japan .................................. 1-39810

[51] Int. Cl.$^5$ ................................................. H03F 3/45
[52] U.S. Cl. ..................................... 330/257; 330/258; 330/261
[58] Field of Search ................ 330/257, 258, 259, 261

[56] References Cited

U.S. PATENT DOCUMENTS 3,671,877  6/1972  Van Den Plassche ............. 330/257
4,147,944  4/1979  Monticelli ....................... 330/257 X

*Primary Examiner*—James B. Mullins
*Attorney, Agent, or Firm*—Finnegan, Henderson, Farabow, Garrett, and Dunner

[57] ABSTRACT

A differential pair of transistors are supplied with input currents at the base electrodes thereof. The emitter electrodes and the collector electrodes of the differential pair are connected in common, respectively. The base electrodes of the differential pair are connected to a current source which provides a constant current which is proportional to the sum of the collector currents of the differential pair.

10 Claims, 4 Drawing Sheets

AMPLIFIER CIRCUIT OPERABLE AT LOW POWER SOURCE VOLTAGE

BACKGROUND OF THE INVENTION

1. Field of the Invention

This invention concerns a differential amplifier. More particularly, this invention concerns an amplifier which produces an amplified output current or a corresponding output voltage in response to a differential input current, and is operative at a relatively low power source voltage, such as 1.0 volt.

2. Description of the Prior Art

Conventionally, a current to voltage converting circuit has been used to produce an output voltage in response to a differential current input signal. FIG. 1 is a circuit diagram of a conventional current to voltage converting circuit disclosed in the U.S. Pat. No. 3,671,877.

In this circuit, the numerals 61 and 62 designate input current sources which supply a direct current component I and an alternating current component $+\Delta i$ or $-\Delta i$. Transistors 63 and 64 are NPN transistors which form a differential pair supplied with the input signal from the current sources 61 and 62 at the base electrodes, respectively. The collector electrodes of the transistors 63 and 64 are connected to the power source voltage Vcc, and the emitter electrodes thereof are connected to the collector electrode of an NPN transistor 65 which forms a current source for the differential pair transistors 63 and 64.

The base electrodes of NPN transistors 66 and 67 are connected to the base electrode of the transistor 65, and the collector electrodes of the transistors 66 and 67 are connected to the input current sources 61 and 62. The transistors 65, 66 and 67 form a current mirror circuit 68.

In this circuit, the collector to emitter path of transistor 63 or 64 and the base to emitter path of transistor 65 are serially connected between the power source Vcc and ground Gnd. Thus, the potential at the emitter electrodes of the transistors 63 and 64 is the base to emitter voltage Vbe (about 0.7 volt) of transistor 65. Therefore, it is necessary to apply a voltage of about 1.4 volt, which is 0.7 volt higher than the emitter potential, to the base electrode of the differential pair transistors 63 and 64 to operate the circuit. Therefore, it is impossible to use the circuit in a circuit which is expected to operate at a relatively low power source voltage, e.g., 1.0 volt.

SUMMARY OF THE INVENTION

Therefore, an object of the present invention is to provide a differential amplifier which is operable at a relatively low power source voltage, such as e.g., 1.0 volt.

Another object of the present invention is to provide a differential amplifier which is operable at a relatively low power source voltage in spite of a simple construction.

To achieve the objects, this invention provides a transistor circuit for outputting an output voltage which corresponds to a difference between a first and a second input current, said circuit being responsive to a first and a second power source voltages, comprising: a first node supplied with the first power source voltage; a second node supplied with the second power source voltage; a first transistor having an emitter electrode, a base electrode and a collector electrode; a second transistor having an emitter electrode connected to the emitter electrode of the first transistor, a collector electrode connected to the collector electrode of the first transistor and a base electrode; input signal supplying means for supplying the first input current to the base electrode of the first transistor and for supplying the second input current to the base electrode of the second transistor; a third transistor having an emitter electrode connected to the first node, a collector electrode connected to the base electrode of the first transistor and a base electrode; a fourth transistor having an emitter electrode connected to the first node, a base electrode connected to the base electrode of the third transistor and a collector electrode connected to the base electrode of the second transistor; current supplying means for supplying a current to the base electrodes of the third and the fourth transistors, the current being proportional to the sum of currents which flow from the collector electrodes of the first and the second transistors, whereby the base electrodes of the first and the second transistors form outputs of the differential amplifier circuit.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Figure 1:
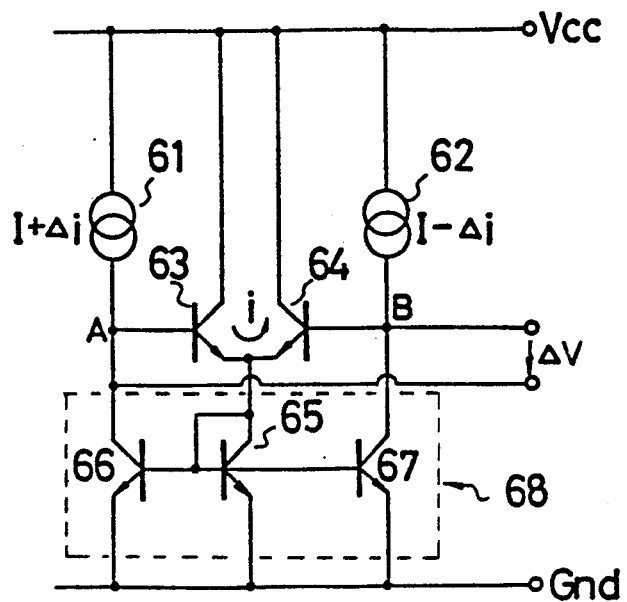
FIG. 1 is a circuit diagram of a conventional differential circuit.

Referring now to the drawings, the present invention will be explained.

Figure 2:
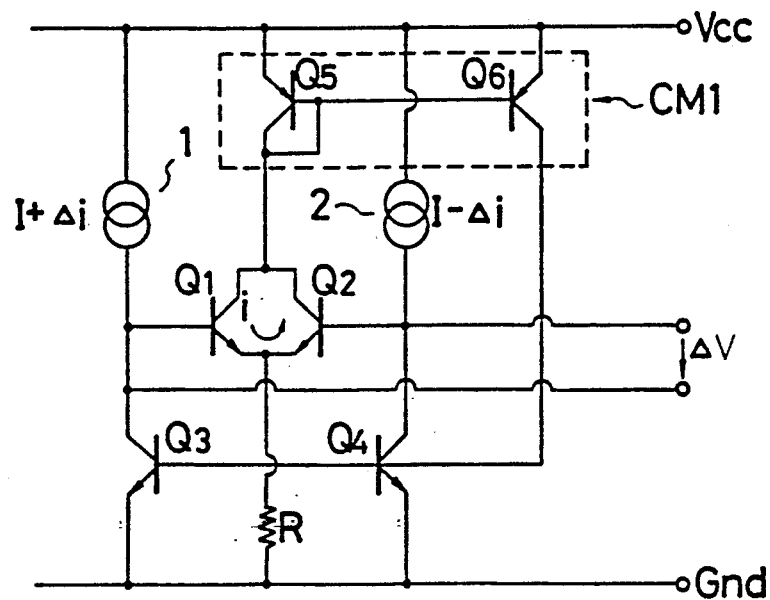
FIG. 2 is a circuit diagram of a first embodiment of the present invention.

FIG. 2 is a circuit diagram of a first embodiment of the present invention. In this invention, there is provided input signal supply means. In the first embodiment, the input signal supply means includes a first input current source 1 and a second input current source 2. The first and the second input current sources provide a direct current component I and an alternating current component $+\Delta i$ or $-\Delta i$, respectively.

NPN transistors Q1 and Q2 form a differential pair. The base electrodes of the transistors Q1 and Q2 are connected to the input current sources 1 and 2, respectively. The emitter electrodes of the transistors Q1 and Q2 are connected in common, and are connected to the ground Gnd through a resistor R. The collector electrodes of the transistors Q1 and Q2 are connected in common.

Emitter electrodes of the transistors Q3 and Q4 are connected to the ground Gnd, and the collector electrodes thereof are connected to the base electrodes of the transistors Q1 and Q2, respectively. The base electrodes of the transistors Q3 and Q4 are connected in common.

In this invention, there is provided current supply means. In this first embodiment, the current supply means includes PNP transistors Q5 and Q6. The collector electrode of the transistor Q5 is connected to the collector electrodes of the transistors Q1 and Q2, and the emitter electrode thereof is connected to the power source voltage Vcc. The base electrode of the transistor Q5 is connected to the collector electrode thereof. Since the collector current of the transistor Q5 is equal to the sum of the collector currents of transistors Q1 and Q2, the collector current of the transistor Q6 is proportional to the sum of the collector currents of transistors Q1 and Q2.

The emitter electrode of the transistor Q6 is connected to the power source voltage Vcc, and the base electrode thereof is connected to the base electrode of the transistor Q5. The PNP transistors Q5 and Q6 form a current mirror circuit CM1. The collector electrode of the transistor Q6 is connected to the base electrodes of the transistors Q3 and Q4. As the result, a current which is proportional to the sum of the collector currents of the transistors Q1 and Q2 is supplied to the base electrodes of transistors Q3 and Q4. In this circuit configuration, the base electrodes of the transistors Q1 and Q2 form output terminals of the amplifier circuit.

In this circuit, the alternating current components $+\Delta i$ and the $-\Delta i$ are supplied to the base electrodes of the transistors Q1 and Q2 as the base currents, since the collector currents of the same value flow through the transistors Q3 and Q4. Due to the alternating current component $\Delta i$, an amplified alternating current component i flows in the transistors Q1 and Q2, and an output voltage $\Delta v$ is generated between the base electrodes of the transistors Q1 and Q2.

Assuming that the sizes of the NPN transistors Q1 and Q2 are the same and the current mirror circuit CM1 is in an ideal condition, the relationship between the amplified alternating current component i and the alternating current component $\Delta i$ can be expressed as follows.

$$i = \beta \cdot \Delta i \tag{1}$$

wherein $\beta$ is a common emitter current gain of the NPN transistors Q1 and Q2.

The base to emitter path of the transistor Q5 is connected between the power source Vcc and the collector electrodes of the transistor Q1 and Q2. Thus, when the power source voltage Vcc is 1.0 volt, the collector potential of the transistors Q1 and Q2 is about 0.3 volt assuming that the base to emitter voltage of the transistor Q5 is about 0.7 volt.

Therefore, by applying a voltage of about 0.7 volt between the base and emitter electrodes of the transistors Q1 and Q2, the differential pair transistors Q1 and Q2 become operable. Thus, the circuit of FIG. 2 is operable at a relatively low power source voltage, such as 1.0 volt.

By inserting resistors between the emitter electrodes of the transistors Q5 and Q6 and the power source Vcc, the dependence of the current mirror ratio of the current mirror circuit CM1 on the power source voltage Vcc can be reduced. Furthermore, by changing the emitter area ratio between the transistor Q5 and Q6, the input impedance of the circuit can be changed or controlled.

Figure 3:
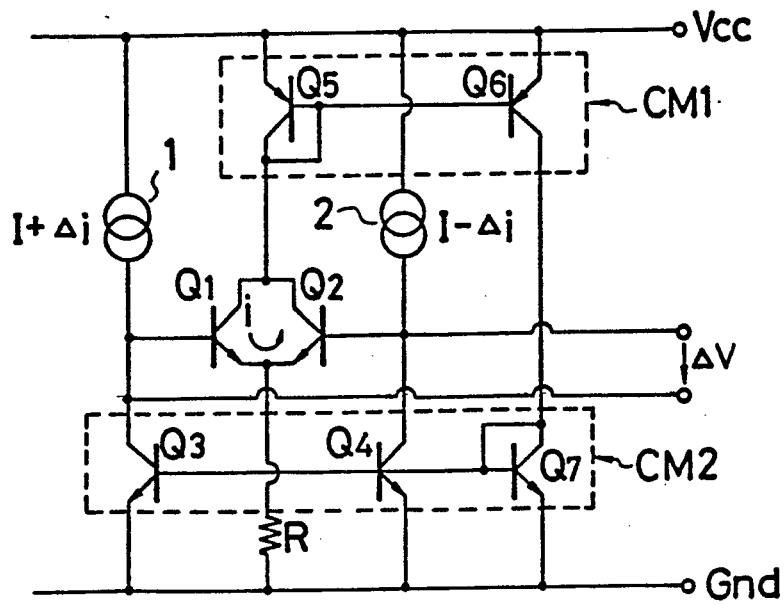
FIG. 3 is a circuit diagram of a second embodiment of the present invention.

FIG. 3 is a circuit diagram of a second embodiment of the present invention. In this circuit, an NPN transistor Q7 is added compared with the first embodiment of FIG. 2. The base electrode of the transistor Q7 is connected to the base electrodes of the transistors Q3 and Q4, and the collector electrode thereof is connected to the collector electrode of the transistor Q6. The base electrode of the transistor Q7 is connected to the collector electrode thereof. Thus, the transistors Q3, Q4 and Q7 form a second current mirror circuit CM2. The rest of the circuit's construction is the same as that of FIG. 2, and the corresponding parts are designated by the same references.

The basic operation of the second embodiment is the same as that of the first embodiment of FIG. 2. However, since the transistors Q3, Q4 and Q7 form a current mirror circuit CM2, the operating current of the NPN transistor Q1 and Q2 can be increased compared with the first embodiment of FIG. 2. Furthermore, the operating current of the transistors Q1 and Q2 does not depend on the common emitter current gain $\beta$ of the NPN transistors Q3 and Q4, since the collector current of the transistor Q7 can be considered to be equal to the collector current of the transistors Q3 and Q4. Because the $\beta$ fluctuates according to the manufacturing conditions, it is desirable to keep the operating current kept independent from the $\beta$ stabilize the circuit.

Figure 4:
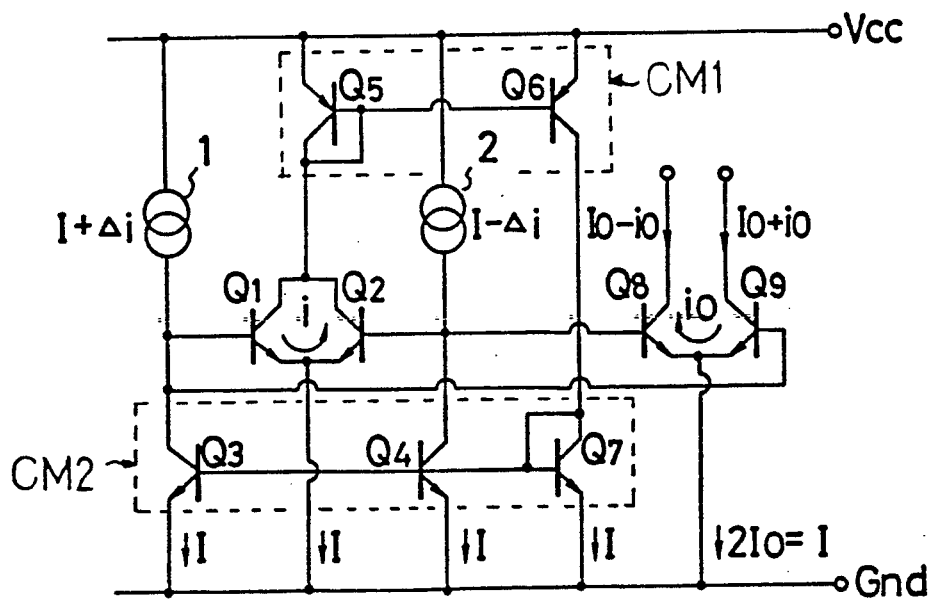
FIG. 4 is a circuit diagram of a third embodiment of the present invention.

FIG. 4 is a circuit diagram of a third embodiment of the present invention. In this circuit, second differential pair transistors Q8 and Q9 are added compared with the third embodiment of FIG. 3. The base electrode of the transistor Q8 is connected to the base electrode of the transistor Q2, and the base electrode of the transistor Q9 is connected to the base electrode of the transistor Q1. The emitter electrodes of the transistors Q8 and Q9 are connected in common and are connected to the ground Gnd. The collector electrodes of the transistors Q8 and Q9 form output terminals of the circuit.

Assuming that the small signal emitter resistances re1 and re2 of the transistors Q1 and Q2 are equal, the output voltage $\Delta v$ between the base electrodes of the transistors Q1 and Q2 can be expressed as follows.

$$\Delta v = 2 \cdot re1 \cdot i \tag{2}$$

and $$\begin{aligned} re1 &= re2 \\ &= Vt/(I/2) \\ &= 2 \cdot Vt/I \end{aligned} \tag{3}$$

wherein Vt is a thermal voltage (kT/q).

Furthermore, assuming that the small signal emitter resistances re8 and re9 of the transistors Q8 and Q9 are equal, the small signal emitter resistances re8 and re9 can be expressed as follows.

$$\Delta v = 2 \cdot re8 \cdot io \tag{4}$$

and $$re8 = re9 \tag{5}$$
$$= Vt/(I/2)$$
$$= 2 \cdot Vt/I$$

Since the base electrodes of transistors Q1, Q2 and transistors Q8 and Q9 are connected to each other in this circuit, the output voltages Δv between the base electrodes of the first differential pair transistors Q1 and Q2 and the second differential pair transistors Q8 and Q9 are equal. Thus, from the equations (2) and (4), the following equation can be achieved.

$$\Delta v = 2 \cdot re1 \cdot i = 2 \cdot re8 \cdot io \tag{6}$$

Now, assuming that the small signal emitter resistances re1 and re8 are equal, the following equation can be achieved.

$$i = io \tag{7}$$

Thus, it can be assumed that the alternating current component Δi is equally supplied to or divided into the two differential pairs. Thus, equation (7) can be rewritten as follows.

$$i = io = \beta \cdot (\Delta i / 2) \tag{8}$$

Therefore, the current conversion gain Gi can be expressed as follows.

$$Gi = io/\Delta i \tag{9}$$
$$= (\beta/2)$$

Thus, a large current conversion gain can be achieved.

Figure 5:
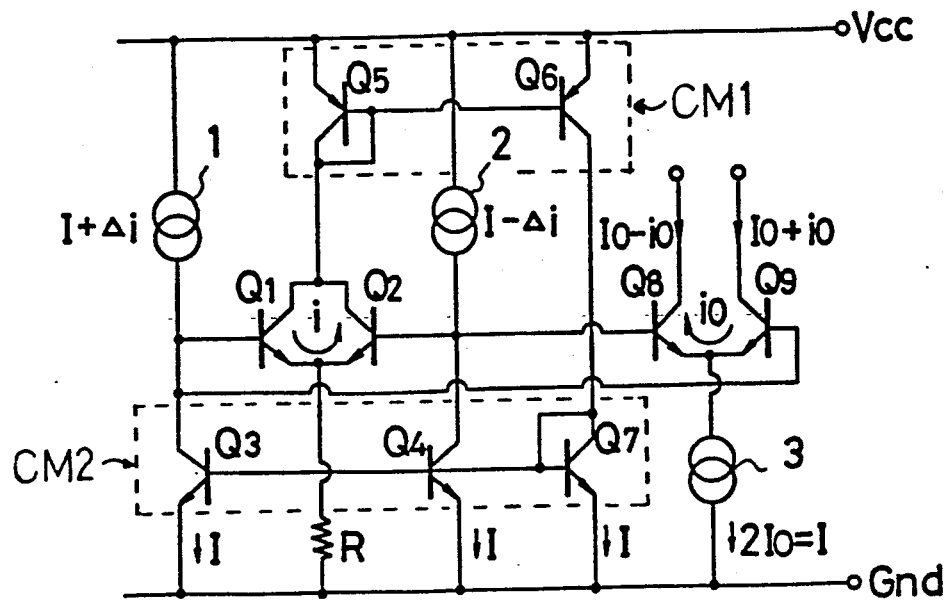
FIG. 5 is a circuit diagram of a fourth embodiment of the present invention.

FIG. 5 is a circuit diagram of a fourth embodiment of the present invention. The difference between this embodiment and the embodiment of FIG. 4 is the connection of a resistor R and a current source 3. Namely, the resistor R is connected between the emitter electrodes of the first differential pair transistor Q1, Q2 and the ground Gnd. The current source 3 is connected between the emitter electrodes of the second differential pair transistors Q8, Q9 and the ground Gnd. The current source 3 provides a constant current 2Io (=I).

The operation of the circuit is basically the same as the circuit shown in FIG. 4. Namely, assuming that the small signal emitter resistances re1 and re2 of the transistors Q1 and Q2 are equal, the output voltage Δv which is obtained between the base electrodes of the transistors Q1 and Q2 can be expressed as follows.

$$\Delta v = 2 \cdot re1 \cdot i \tag{10}$$

and $$re1 = re2 \tag{11}$$
$$= Vt/(I/2)$$
$$= 2 \cdot Vt/I$$

Furthermore, assuming that the small signal resistances re8 and re9 of the transistors Q8 and Q9 are also equal, the output voltage Δv can be expressed as follows, $$\Delta v = 2 \cdot re8 \cdot io \tag{12}$$

and the small signal resistances re8 and re9 can be expressed as follows.

$$re8 = re9 \tag{13}$$
$$= Vt/Io$$

For simplicity, assuming that the Io=I/2, the small signal emitter resistances re1, re2, re8 and re9 can be expressed as follows.

$$re8 = re9 \tag{14}$$
$$= 2 \cdot Vt/I$$
$$= re1 = re2$$

Since the base electrodes of the transistors Q1 and Q2 are connected to the base electrodes of the transistors Q9 and Q8 respectively, the differential output voltage Δv is equal. Thus, from equations (10) and (12), the following equation can be achieved.

$$\Delta v = 2 \cdot re1 \cdot i = 2 \cdot re8 \cdot io \tag{15}$$

Thus, similarly to that of FIG. 4, the output current io and the current conversion ratio Gi can be expressed as follows.

$$io = i = (\beta/2) \cdot \Delta i \tag{16}$$

$$Gi = io/\Delta i = \beta/2 \tag{17}$$

In the above description, it is assumed that 2Io=I, for simplicity. However, by changing the value of the current source 3, it is possible to change the current convertion gain Gi.

Figure 6:
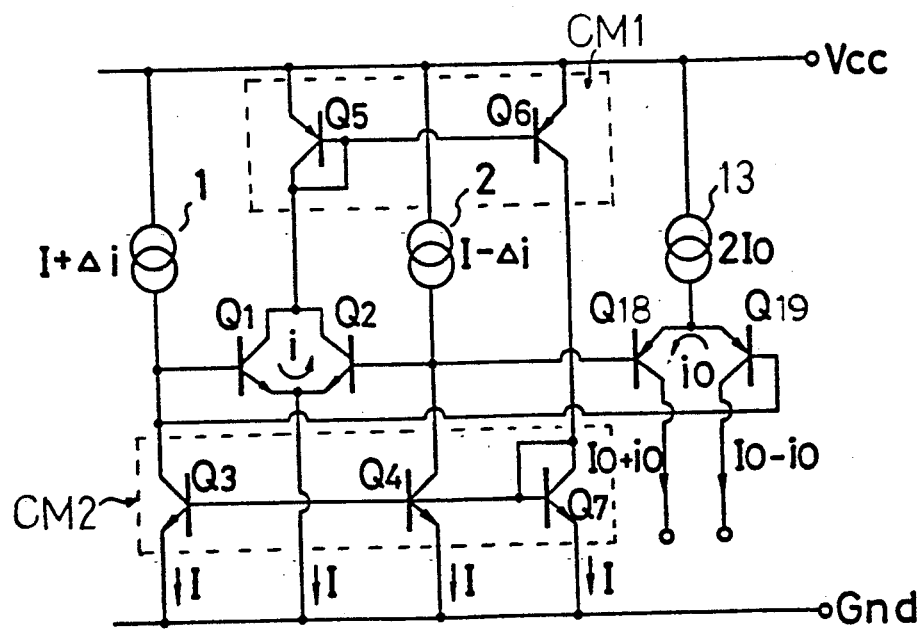
FIG. 6 is a circuit diagram of a fifth embodiment of the present invention.

FIG. 6 is a fifth embodiment of the present invention. In the embodiment, PNP transistors Q18 and Q19 are used instead of the NPN transistors Q8 and Q9 used in the embodiment shown in FIG. 5, and a current source 13 is connected between the emitter electrodes of the transistors Q18, Q19 and the power source voltage Vcc. The basic operation of the embodiment is the same as the embodiment of FIG. 5.

Assuming that the emitter common current gain β of the PNP transistors Q18 and Q19 is equal to that of the NPN transistors Q8 and Q9, the amplified alternating current components i and io and the current conversion gain Gi can be expressed as follows, in the same way as the embodiment shown in FIG. 5

$$io = i = (\beta/2) \cdot \Delta i \tag{18}$$

$$Gi = io/\Delta i \tag{19}$$
$$= \beta/2$$

Figure 7:
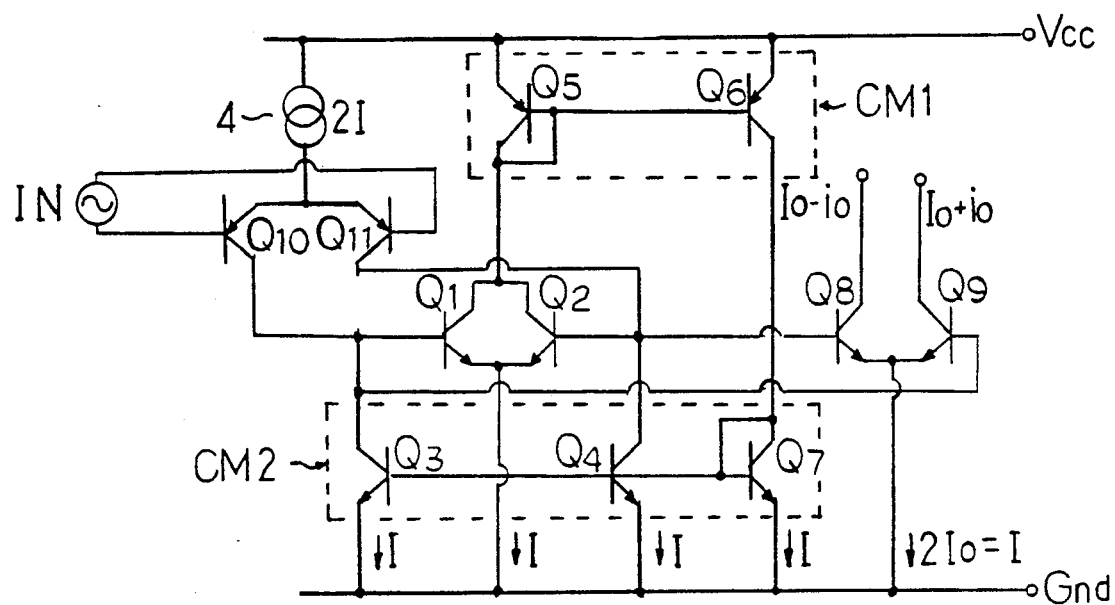
FIG. 7 is a circuit diagram of a sixth embodiment of the present invention.

FIG. 7 is a circuit diagram of a sixth embodiment of the present invention. In this embodiment, an example of the detailed construction of the input current sources 1 and shown in FIG. 4 is shown. Namely, a differential pair of transistors Q10 and Q11 is provided, and the base electrodes of the transistors Q10 and Q11 are supplied with an input IN. The emitter electrodes of the transistors Q10 and Q11 are connected to the power source Vcc through a current source 4 which provides a current 2I. The collector electrodes of the transistors Q10 and Q11 are connected to the base electrodes of the transistors Q1 and Q2. The transistors Q1 and Q2 form the first and the second current sources 1 and 2 in FIG. 4. The remaining details of construction and operation of the circuit are the same as in the circuit of the embodiment shown in FIG. 4.

In the aforementioned embodiments, the circuit is connected between the positive power source voltage Vcc and ground Gnd. However, it is possible to change the positive power source voltage Vcc to ground and ground to a negative power source voltage Vee, respectively. Furthermore, it is possible to reverse the high and low power level relationship by changing the polarity of the transistors.

The present invention has been described with respect to specific embodiments. However, other embodiments based on the principles of the present invention should be obvious to those of ordinary skill in the art. Such embodiments are intended to be covered by the claims.

What is claimed is:

1. A transistor circuit for outputting an output voltage which corresponds to a difference between a first and a second input current, said circuit being responsive to a first and a second power source voltages, comprising:
   a first node supplied with the first power source voltage;
   a second node supplied with the second power source voltage;
   a first transistor having an emitter electrode, a base electrode and a collector electrode;
   a second transistor having an emitter electrode connected to the emitter electrode of the first transistor, a collector electrode connected to the collector electrode of the first transistor and a base electrode;
   input signal supplying means for supplying the first input current to the base electrode of the first transistor and for supplying the second input current to the base electrode of the second transistor;
   a third transistor having an emitter electrode connected to the first node, a collector electrode connected to the base electrode of the first transistor and a base electrode;
   a fourth transistor having an emitter electrode connected to the first node, a base electrode connected to the base electrode of the third transistor and a collector electrode connected to the base electrode of the second transistor;
   current supplying means for supplying a current to the base electrodes of the third and the fourth transistors, the current being proportional to the sum of currents which flow from the collector electrodes of the first and the second transistors, whereby the base electrodes of the first and the second transistors form outputs of the differential amplifier circuit.

2. The transistor circuit of claim 1, wherein the current supplying means includes a fifth transistor having an emitter electrode connected to the second node, a collector electrode connected to the collector electrodes of the first and the second transistors and a base electrodes, and a sixth transistor having an emitter electrode connected to the second node, a base electrode connected to the base electrode of the fifth transistor and a collector electrode connected to the base electrodes of the third and the fourth transistors.

3. The transistor circuit of claim 2, wherein the current supplying means further includes a seventh transistor having an emitter electrode connected to the first node, a base electrode connected to the base electrodes of the third and the fourth transistors and a collector electrode connected to the base electrode thereof and to the collector electrode of the sixth transistor.

4. The transistor circuit of claim 1, wherein the input signal supplying means includes a fifth transistor having an emitter electrode connected to the second node, a base electrode supplied with an input signal and a collector electrode connected to the base electrode of the first transistor, and an sixth transistor having an emitter electrode connected to the second node, a base electrode supplied with the input signal and a collector electrode connected to the base electrode of the second transistor.

5. A current amplifier circuit for outputting an output current which is proportional to a difference in a first input current and a second input current, comprising:
   a first node supplied with a first power source voltage;
   a second node supplied with a second power source voltage;
   a first transistor having an emitter electrode connected to the first node, a collector electrode connected to the second node and a base electrode;
   a second transistor having an emitter electrode connected to the emitter electrode of the first transistor, a collector electrode connected to the collector electrode of the first transistor and a base electrode;
   input current supplying means for supplying the first input current to the base electrode of the first transistor and for supplying the second input current to the base electrode of the second transistor;
   a third transistor having an emitter electrode connected to the first node, a collector electrode connected to the base electrode of the first transistor and a base electrode;
   a fourth transistor having an emitter electrode connected to the first node, a base electrode connected to the base electrode of the third transistor and a collector electrode connected to the base electrode of the second transistor;
   current supplying means for supplying a current to the base electrode of the third and the fourth transistors, the current being proportional to the sum of the currents which flow from the collector electrodes of the first and the second transistors;
   a differential transistor pair including fifth and sixth transistors each having an emitter electrode, a base electrode and a collector electrode, the base electrode of the fifth transistor being connected to the base electrode of the first transistor and the base electrode of the sixth transistor being connected to the base electrode of the second transistor, the emitter electrodes of the fifth and the sixth transistors being connected in common and connected to the first node; whereby the collector electrodes of the fifth and the sixth transistors form outputs of the current amplifier circuit.

6. The current amplifier circuit of claim 5, wherein the current supplying circuit includes a seventh transistor having an emitter electrode connected to the second node, a collector electrode connected to the collector electrodes of the first and the second transistor and a base electrode connected to the collector electrode thereof, and an eighth transistor having an emitter electrode connected to the second node, a base electrode connected to the base electrode of the seventh transistor and a collector electrode connected to the base electrodes of the third and the fourth transistors.

7. The current amplifier circuit of claim 6, wherein the current supplying means further includes a ninth transistor having an emitter electrode connected to the first node, a base electrode connected to the base electrode of the third and the fourth transistor and collector electrode connected to the collector electrode of the eighth transistor.

8. A current amplifier circuit for outputting an output current which is proportional to a difference in a first input current and a second input current, comprising:
a first node supplied with a first power source voltage;
a second node supplied with a second power source voltage;
a first transistor having an emitter electrode connected to the first node, a collector electrode connected to the second node and a base electrode;
a second transistor having an emitter electrode connected to the emitter electrode of the first transistor, a collector electrode connected to the collector electrode of the first transistor and a base electrode;
input current supplying means for supplying the first input current to the base electrode of the first transistor and for supplying the second input current to the base electrode of the second transistor;
a third transistor having an emitter electrode connected to the first node, a collector electrode connected to the base electrode of the first transistor and a base electrode;
a fourth transistor having an emitter electrode connected to the first node, a base electrode connected to the base electrode of the third transistor and a collector electrode connected to the base electrode of the second transistor;
current supplying means for supplying a current to the base electrode of the third and fourth transistors, the current being proportional to the sum of the currents which flow from the collector electrodes of the first and the second transistors;
a differential transistor pair including fifth and sixth transistors each having an emitter electrode, a base electrode and a collector electrode, the base electrode of the fifth transistor being connected to the base electrode of the first transistor and the base electrode of the sixth transistor being connected to the base electrode of the second transistor, the emitter electrodes of the fifth and sixth transistors being connected in common and connected to the second node; whereby the collector electrodes of the fifth and sixth transistors form outputs of the current amplifier circuit.

9. The current amplifier circuit of claim 8, wherein the current supplying circuit includes a seventh transistor having an emitter electrode connected to the second node, a collector electrode connected to the collector electrodes of the first and the second transistors and a base electrode connected to the collector electrode thereof, and an eighth transistor having an emitter electrode connected to the second node, a base electrode connected to the base electrode of the seventh transistor and a collector electrode connected to the base electrodes of the third and the fourth transistors.

10. The current amplifier circuit of claim 9, wherein the current supplying means further includes a ninth transistor having an emitter electrode connected to the first node, a base electrode connected to the base electrode of the third and the fourth transistor and a collector electrode connected to the collector electrode of the eighth transistor.

* * * * *